(12) United States Patent
Yuan et al.

(10) Patent No.: US 7,164,328 B2
(45) Date of Patent: Jan. 16, 2007

(54) DIRECT DIGITAL AMPLITUDE MODULATOR

(75) Inventors: Jiren Yuan, Lund (SE); Yijun Zhou, Lund (SE)

(73) Assignee: Infineon Technologies Wireless Solutions Sweden AB, Kista (SE)

( * ) Notice: Subject to any disclaimer, the term of this patent is extended or adjusted under 35 U.S.C. 154(b) by 756 days.

(21) Appl. No.: 10/426,557

(22) Filed: Apr. 30, 2003

(65) Prior Publication Data
US 2005/0074073 A1    Apr. 7, 2005

Related U.S. Application Data

(63) Continuation of application No. PCT/SE01/02411, filed on Nov. 1, 2001.

(30) Foreign Application Priority Data
Nov. 1, 2001    (SE)    ..................... 02411/01

(51) Int. Cl.
*H03C 1/00*    (2006.01)
*H03C 3/00*    (2006.01)
*H04L 27/36*    (2006.01)

(52) U.S. Cl. ................ 332/149; 332/103; 375/298
(58) Field of Classification Search ........ 332/103–105, 332/149, 159, 178; 375/296–298, 300, 302
See application file for complete search history.

(56) References Cited

U.S. PATENT DOCUMENTS

2005/0074073 A1*   4/2005  Yuan et al. ................ 375/268

FOREIGN PATENT DOCUMENTS

| GB | 2 118 384 A | 10/1983 |
| WO | WO 99/11040 | 3/1999 |
| WO | WO 99/52206 | 10/1999 |

* cited by examiner

*Primary Examiner*—David Mis
(74) *Attorney, Agent, or Firm*—Baker Botts L.L.P.

(57) ABSTRACT

Various embodiments of a direct digital amplitude modulator (DDAM) for modulating radio frequency (RF) or intermediate frequency (IF) or baseband signal with the invented interpolation technique are disclosed. The interpolation technique greatly reduces the amplitudes of alias signals without using an analog filter. The embodiments therefore are significant for various communication transmitters to achieve simple structure, good linearity and high power efficiency.

20 Claims, 5 Drawing Sheets

DIRECT DIGITAL AMPLITUDE MODULATOR

CROSS REFERENCE TO RELATED APPLICATION

This application is a continuation of copending International Application No. PCT/SE01/02411 filed Nov. 1, 2001, which designates the United States, and claims priority to Sweden application number 0004031-1 filed Nov. 3, 2000, the contents of which are hereby incorporated by reference in its entirety.

BACKGROUND OF THE INVENTION

The invention relates generally to communication transmitters requiring amplitude modulation. Modern communication systems, such as cable, cellular and satellite communications, employ non-constant envelop digital modulation to increase spectral efficiency, such as quadrature phase-shift keying (QPSK), offset QPSK (OQPSK) and quadrature amplitude modulation (QAM) etc. To transmit a non-constant envelop signal, a linear power amplifier is required in the transmitter which usually has a low power efficiency and insufficient linearity. A direct digital amplitude modulator is of great interest for a transmitter to achieve simple structure, good linearity and high power efficiency in various communication systems.

FIG. 1 and FIG. 2 are the block diagrams of an exemplary QAM modulator. In FIG. 1, input data 100 is split into digital in-phase (I) signal 102a and quadrature (Q) signal 102b through digital signal processing (DSP) unit 101. Digital-to-analog converters (DACs) 103a and 103b are used to convert I signal 102a and Q signal 102b to analog signals, and low pass filters 104a and 104b are used to clear the alias components of the DAC outputs. In amplitude modulators 105a and 105b, the outputs of low pass filters 104a and 104b modulate carrier signals 106a and 106b which phases are separated in 90 degrees. The outputs of modulators 105a and 105b are combined in combiner 107, and the output of combiner 107 is amplified through linear power amplifier 108.

The polar modulation technique is shown in FIG. 2. Data 200 is split into digital amplitude signal 202a and phase signal 202b by DSP unit 201. Digital amplitude signal 202a is converted to analog amplitude signal through DAC 203, and low pass filter 205 clears the alias components of the DAC output. Digital phase signal 202b modulates input carrier 207 in phase modulator 204, and modulated carrier signal 206b is amplified through power amplifier 208. The gain of power amplifier 208 is linearly controlled by analog amplitude signal 206a. The embodiment in FIG. 2 is more power efficient than that in FIG. 1, as the modulated carrier signal is a constant envelop signal, a nonlinear power amplifier can be used.

FIG. 3a shows a conventional DAC 301 with an analog reconstruction filter 302, and the spectra of digital input signal 300 and analog output signal 303 are showed in FIG. 3b and FIG. 3c respectively. From FIGS. 3b and 3c, when a broadband signal is transmitted, it is difficult to filter out the alias signals of the DAC output, and the wanted signal is distorted due to the DAC's non-flat sinc response. As the clock frequency ($f_s$) increases, the attenuation of the alias signal is increased, and the distortion of the signal is reduced.

The embodiments in FIG. 1 and FIG. 2 are not suitable for full system integration, especially in broadband data transmission. Due to the limitation of clock frequency ($f_s$), they need complex analog reconstruction filters to remove alias signals. The analog reconstruction filter may even need discrete components.

In mobile communications, a high efficiency power amplifier (PA) is essential, because the PA dominates the power consumption of the portable system. RF power amplifiers are most efficient when they work in switching mode and amplify a constant envelop signal. The amplification of a non-constant envelop signal requires a linear PA which is inherently less power efficient.

SUMMARY OF THE INVENTION

The objective of the present invention is to provide a direct digital amplitude modulator (DDAM) for non-constant envelop modulation. It will be easily integrated with other parts of a transmitter system to achieve a fully digitized transmitter with simple structure, good linearity, high power efficiency and low requirement on the output filter.

DETAILED DESCRIPTION OF THE PREFERRED EMBODIMENTS

The preferred embodiments of the present invention and its advantages are best understood by referring to FIG. 1–FIG. 9 of the drawings.

Figure 1:
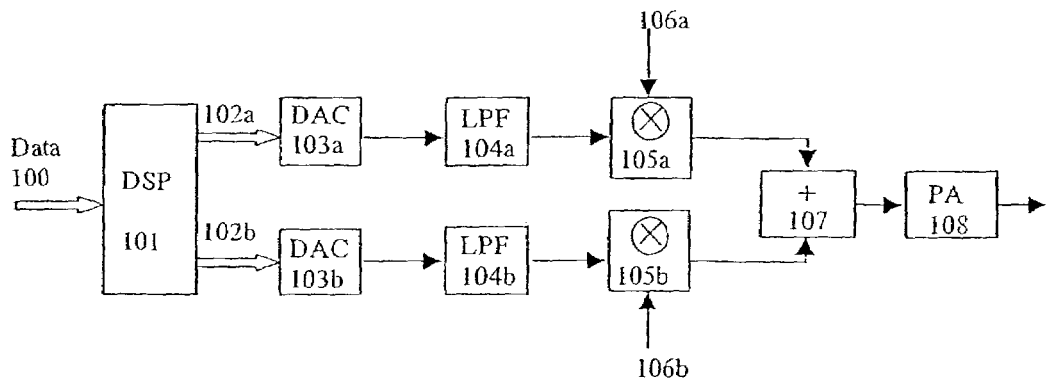
FIG. 1 illustrates a conventional I–Q quadrature modulator.
Figure 2:
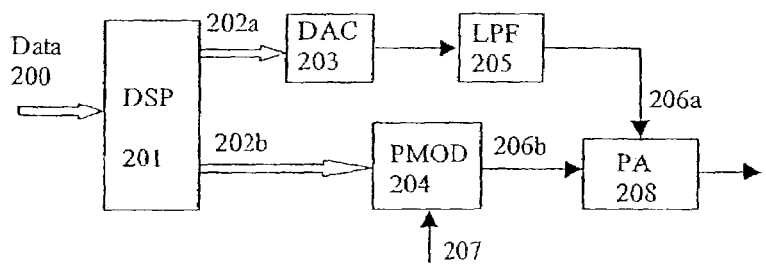
FIG. 2 illustrates a conventional polar modulator.
Figure 3A:
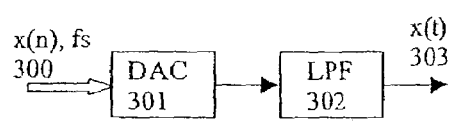
FIG. 3 illustrates a conventional DAC, its digital input and analog output spectra.
Figure 3B:
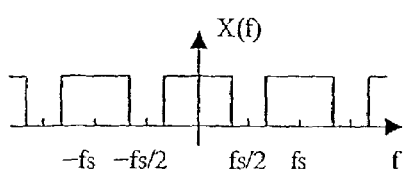
Figure 3C:
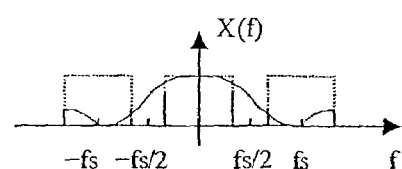
Figure 4:
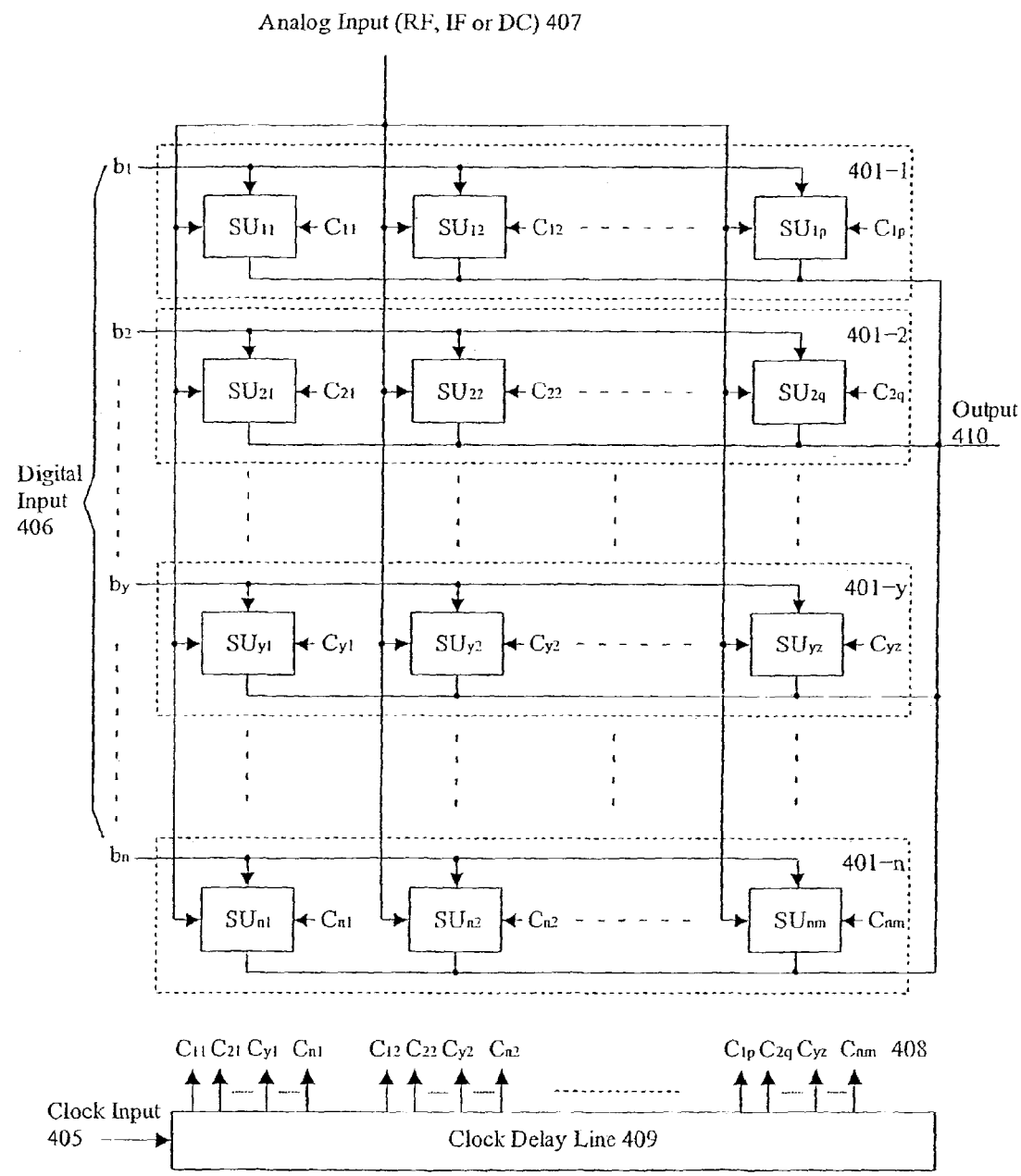
FIG. 4 shows, in the form of a block diagram, the principal and the detail of the invented direct digital amplitude modulator (DDAM).

Referring to FIG. 4, the block diagram of the direct digital amplitude modulator (DDAM) according to the present invention is shown. The n-bit digital amplitude input signal 406 controls the binary-weight switched RF, IF or DC current sources 401-1, 401-2, ..., 401-n. The binary-weight switched current source in each bit is divided into sub-switched current source units (SUs). In the least significant bit (LSB) $b_1$, it is divided into p sub-switched current source units $SU_{11}, SU_{12}, \ldots SU_{1p}$. In an arbitrary bit $b_y$, it is divided into z sub-switched current source units $SU_{y1}, SU_{y2}, \ldots, SU_{yz}$. In the most significant bit (MSB) $b_n$, it is divided into m sub-switched current source units $SU_{n1}, SU_{n2}, \ldots, SU_{nm}$. The numbers of sub-switched current source units in different bits can be equal or different, depending on the minimum size available in the technology and/or the density of interpolation. The sizes of SUs in each bit can be equal or different, depending on the type of interpolation.

Clock signal 405 which is synchronized with digital input 406 and has a frequency $f_s$, is divided into a number of delayed clock signals 408 with delays in one period of digital input 406 through clock delay line 409. For an arbitrary bit $b_y$, there are z delayed clock signals, and the intervals between these clock signals are equal in the normal case but can be unequal if necessary. The effective clock frequency of $b_y$ is therefore increased to $zf_s$. If m/z is set to an integer, clock delay line 409 is simplified, but it is not compulsory. In the case of linear interpolation, the current sources are divided into equal size SUs in each bit. In other cases, it can be divided into different sizes according to the selected interpolation function. Analog input signal 407 to the sub-switched current source units can be an RF, IF or DC signal. When the input signal is RF or IF, output 410 is an amplitude modulated RF or IF signal. When the input signal is DC, output 410 is an amplitude modulated baseband signal. Because of the higher effective clock frequency and the interpolation function, the DDAM's alias signal's attenuation is increased, and the requirement on the output analog filter is alleviated. With an RC charge and discharge hold (RCH) circuit which will be explained in the description of FIG. 5a, the alias signals' attenuation is further increased.

Figure 5A:
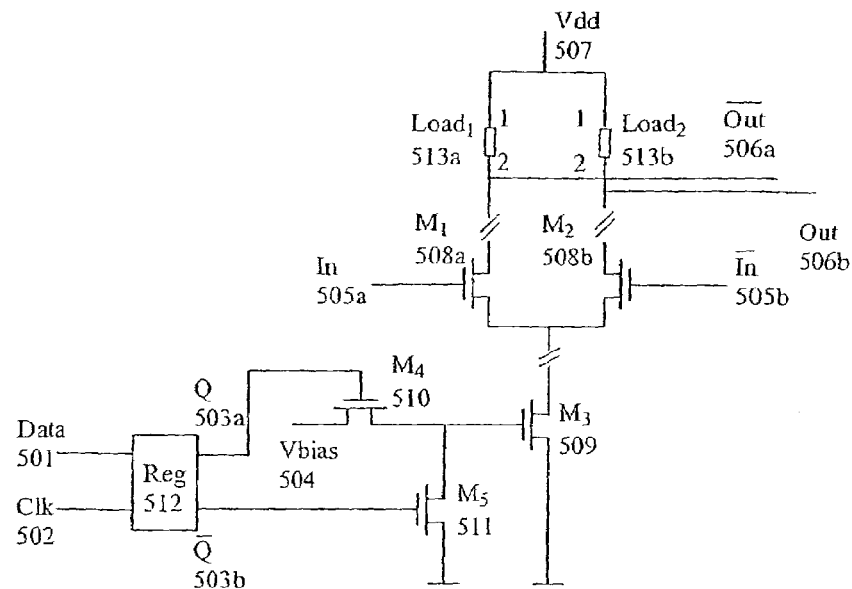
FIG. 5a shows the first embodiment of a sub-switched current source unit in this invention.

FIG. 5a shows the first embodiment of the sub-switched current source units when the analog input is an RF or IF signal. Data signal 501 is obtained from DDAM's digital input signal 406, and clock signal 502 is obtained from clock delay line 409 in the DDAM. Data and clock signals 501 and 502 are sent to register 512 to produce output signal 503a and inverse output signal 503b. Transistors $M_4$ 510 and $M_5$ 511, controlled by output signal 503a and inverse output signal 503b of register 512 respectively, act as switches to current source transistor $M_3$ 509. The dimensions of transistors $M_4$ 510 and $M_5$ 511 can be properly selected in order to set the switching time constant together with the parasitic capacitance to obtain a hold character somewhere between zero-order-hold and first-order-hold. The RC charge and discharge hold (RCH) character can achieve higher attenuation for the alias signals. The differential RF or IF signals are fed to transistors $M_1$ 508a and $M_2$ 508b. The power supply is provided via two loads $Load_1$ 513a and $Load_2$ 513b (not include in each sub-switched current source unit) which can be active or passive, on-chip or off-chip. Differential RF or IF output 506a and 506b are obtained from the drains of transistors $M_1$ 508a and $M_2$ 508b, and either of them can be a single-ended output. Transistors $M_1$ 508a and $M_2$ 508b can be separated from sub-switched current source unit and combined with other components.

Figure 5B:
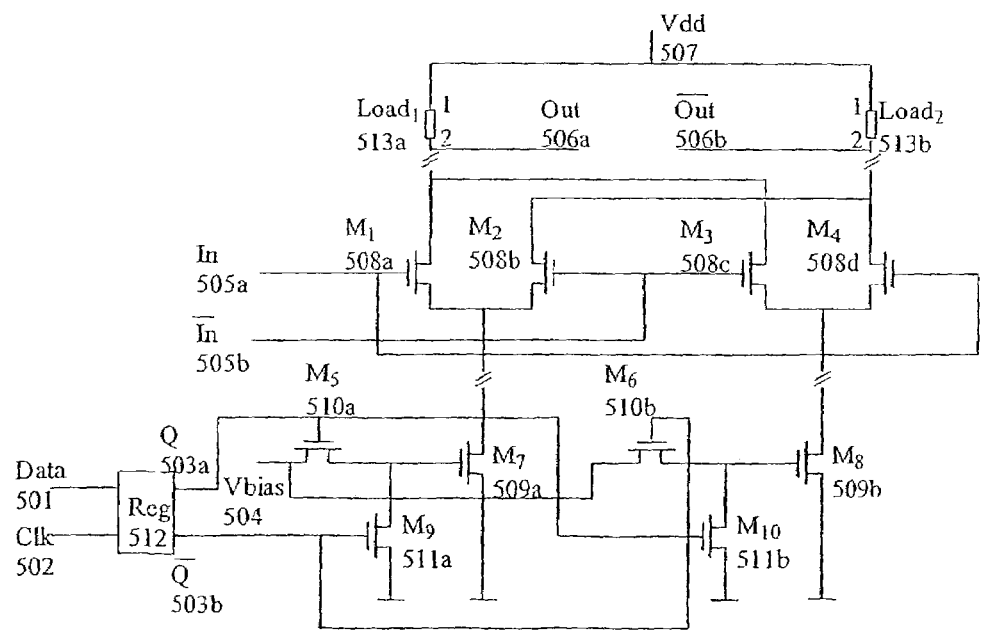
FIG. 5b shows an extension of the first embodiment of a sub-switched current source unit in this invention.

FIG. 5b shows an extension of the first embodiment of the sub-switched current source units which realize a carrier suppressed DDAM. It uses two of the first embodiments in FIG. 5a, where signals 501, 502, 503a, 503b, 504 and register 512 are shared. Transistors $M_5$ 510a and $M_{10}$ 511b, $M_6$ 510b and $M_9$ 511a are controlled by output signal 503a and inverse output signal 503b of register 512 respectively. The differential RF or IF signals are fed to transistors $M_1$ 508a and $M_4$ 508d, $M_2$ 508b and $M_3$ 508c respectively. The drains of transistors $M_1$ 508a and $M_3$ 508c are connected together, and the drains of transistors $M_2$ 508b and $M_4$ 508d are connected together. The power supply is provided via loads $Load_1$ 513a and $Load_2$ 513b (not include in each sub-switched current source unit) which can be active or passive, on-chip or off-chip. Transistors $M_1$ 508a, $M_2$ 508b, $M_3$ 508c and $M_4$ 508d can be separated from sub-switched current source unit and combined with other components.

Figure 6:
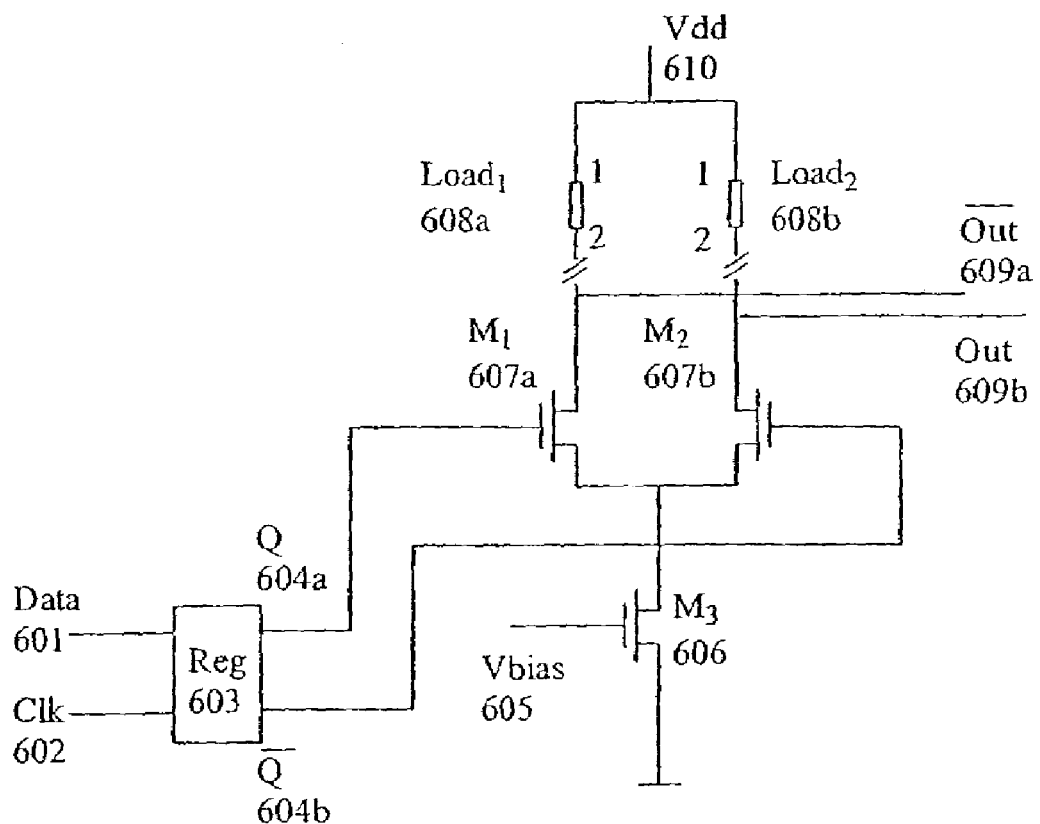
FIG. 6 shows the second embodiment of a sub-switched current source unit in this invention.

FIG. 6 shows the second embodiment of the sub-switched current source units when the analog input is a DC signal (i.e. the DC power supply). Data signal 601 is obtained from DDAM's digital input 406, and clock signal 602 is obtained from clock delay line 409 in the DDAM. They are sent to register 603. Output 604a and inverse output 604b of register 603 are sent to two switching transistors $M_1$ 607a and $M_2$ 607b. Bias signal 605 controls the bias of current source transistor $M_3$ 606. $Load_1$ 608a and $Load_2$ 608b (not include in each sub-switched current source unit) connected to power supply 610 are the loads of switching transistors $M_1$ 607a and $M_2$ 607b respectively, which can be active or passive, on-chip or off-chip. Differential baseband outputs 609a and 609b are obtained from the drains of switching transistors $M_1$ 607a and $M_2$ 607b, and either of them can be a single-ended output.

Figure 7:
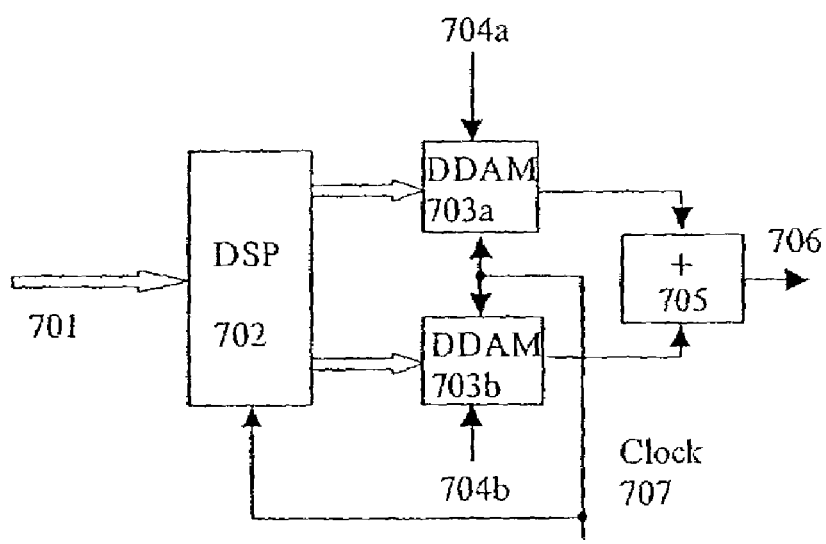
FIG. 7 shows an I–Q quadrature amplitude modulator based on this invention.

FIG. 7 shows a quadrature modulator for RF or IF carrier signal based on this invention. Data 701 to be transmitted is split into digital I signal and Q signal by DSP unit 702. In DDAMs 703a and 703b, the I and Q signals modulate carrier input signals 704a and 704b which phases are separated in 90 degrees. Input clock 707 is used by DSP unit 702 and DDAMs 703a and 703b. The DDAM's outputs are combined in combiner 705 to produce a digitally modulated non-constant envelop signal 706. Most alias signals are attenuated by the DDAM's transfer function.

Figure 8:
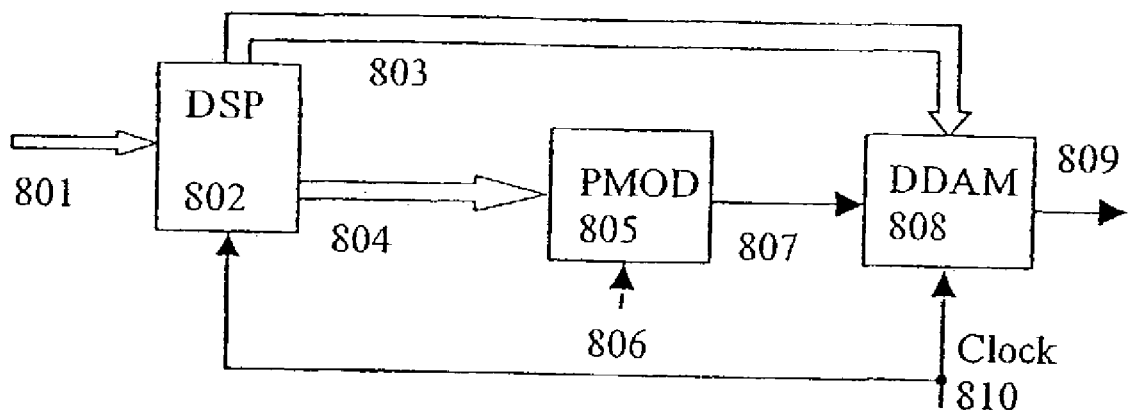
FIG. 8 shows the first embodiment of a polar modulator based on this invention.

The polar modulation technique based on this invention is shown in FIG. 8. Data 801 is split into digital amplitude and phase signals 803 and 804 respectively through DSP 802. Digital phase signal 804 modulates the phase of the input carrier signal 806 and produces a phase modulated constant envelope signal 807 fed to the analog input of DDAM 808. Input clock 810 is used by DSP unit 802 and DDAM 808. Through DDAM 808, digital amplitude signal 803 modulates the amplitude of signal 807 to produce a digitally modulated non-constant envelop signal 809 in which the alias signals are greatly reduced.

Figure 9:
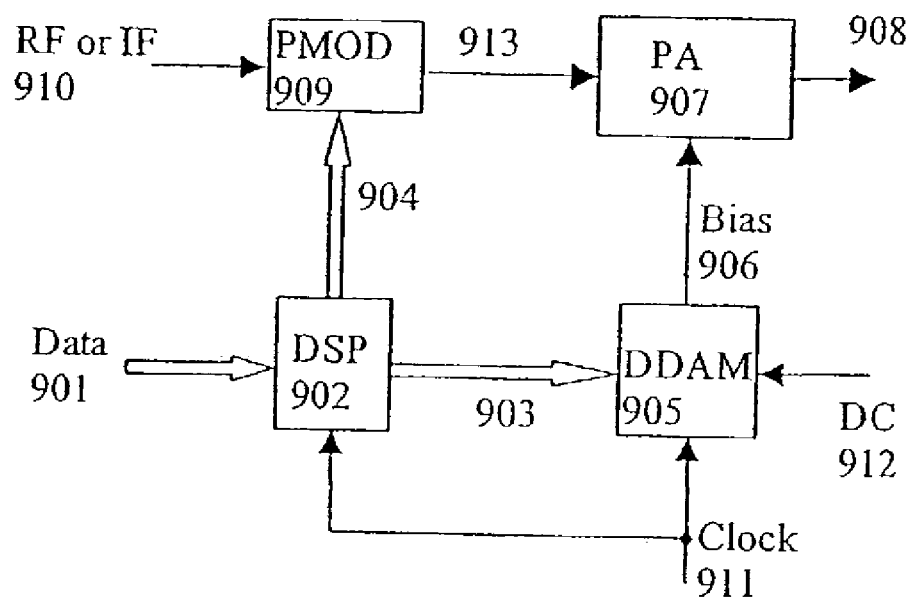
FIG. 9 shows the second embodiment of a polar modulator based on this invention.

Instead of modulating RF and IF carrier signals directly, the invented DDAM can be used to control the bias voltage or current of an RF or IF power amplifier to produce a non-constant envelop digitally modulated signal with reduced alias components. FIG. 9 shows such an embodiment. In FIG. 9, DSP unit 902 splits input data 901 into digital amplitude signal 903 and digital phase signal 904. Digital phase signal 904 modulates RF or IF input carrier signal 910 in phase modulator 909. The phase modulated constant envelope RF or IF signal 913 is amplified in a variable gain power amplifier 907. The gain of the variable gain power amplifier is linearly controlled by bias signal 906. Digital amplitude signal 903 from DSP unit 902 is fed to the digital input of DDAM 905 to produce a baseband bias signal 906 with reduced alias components. The output of DDAM 905 controls the gain of amplifier 907 to produce a digitally modulated non-constant envelop RF or IF signal 908 with reduced alias components. When DSP unit 902 and phase modulator 909 are removed, this embodiment can be used as an amplitude modulator. In this case, signal 903 and signal 913 are replaced by Data 901 and RF or IF 910 respectively.

The proposed invention provides solutions for digitized transmitters. Although preferred embodiments of the present invention have been illustrated in the accompanying drawings and described in the foregoing detailed descriptions, various modifications may be made without departing from the spirit or scope of the general invented concept as defined by the appended claims and their equivalents.

The invention claimed is:

1. A direct digital amplitude modulator (DDAM) for generating an amplitude modulated signal; comprising:
    an n-bit digital input with n parallel inputs, an analog input, a clock input and an output; and
    an n-bit digital input signal fed to the n-bit digital input for direct digital amplitude modulation; and
    an analog input signal fed to the analog input to be modulated which can be an RF, IF or DC signal; and
    a clock input signal fed to the clock input synchronized with the digital input signal; and
    a clock delay line to produce delayed clock signals from the clock input signal with equal or unequal intervals in one period of the digital input signal; and
    a number of sub-switched current source units to be switched on or off according to the combinations of the digital input signal and the delayed clock signals to produce or to cancel quantized RF, IF or DC currents and/or voltages at the times precisely controlled by the delayed clock signals respectively; and
    a circuitry to combine the outputs of the sub-switched current source units, and in the simplest case the outputs of sub-switched current source units are just connected together to the output; and
    the said sub-switched current source units are grouped into n groups controlled by n-bit digital input signals respectively; and
    the values of currents and/or voltages generated by the said groups calculated by the lumped current and/or voltage values of the sub-switched current source units in every groups have binary weights in normal case but can be other weights if necessary; and
    the values of currents and/or voltages generated by the said sub-switched current source units in each group can be equal in the case of linear interpolation or unequal in the case of nonlinear interpolation depending on the interpolation function; and
    the effective clock frequency of the DDAM can be greatly increased by the above arrangement when the number of sub-switched current source units and also the number of delayed clocks increases to reduce alias signal components.

2. A quadrature modulator according to claim 1; comprising:
    a digital signal processing unit with one data input, one clock input and two digital outputs; and
    two DDAMs according to claim 1; and
    a combiner with two inputs and one output; and
    an digital input signal fed to the data input of the digital signal processing unit; and
    a clock input signal, synchronized with the digital input signal, fed to the clock input of the digital signal processing unit and the clock inputs of the two DDAMs according to claim 1 simultaneously; and
    two analog input signals which phases are separated in 90 degrees fed to the analog inputs of two DDAMs respectively according to claim 1; and
    the digital signal processing unit splits the digital input signal into I digital signal and Q digital signal fed to the digital inputs of two DDAMs according to claim 1 respectively; and
    the outputs of two DDAMs according to claim 1 are fed to the two inputs of the combiner; and
    an quadrature modulated signal is obtained from the output of the combiner.

3. A first embodiment of a polar modulator according to claim 1, comprising:
    a digital signal processing unit with one data input, one clock input and two digital outputs; and
    a DDAM according to claim 1; and
    a phase modulator with one digital input, one analog input and one analog output; and an digital input signal fed to the data input of the digital signal processing unit; and
    an analog input signal fed to the analog input of the phase modulator; and
    a clock input signal, synchronized with the digital input signal, fed to the clock input of the digital signal processing unit and the clock input of the DDAM according to claim 1 simultaneously; and
    the digital signal processing unit splits the digital input signal into an digital amplitude signal fed to the digital input of the DDAM according to claim 1 and an digital phase signal fed to the digital input of the phase modulator; and
    the analog output of the phase modulator which is a phase modulated constant envelop signal is fed to the analog input of the DDAM according to claim 1;
    and a polar modulated signal is obtained from the output of the DDAM according to claim 1.

4. A second embodiment of a polar modulator according to claim 1; comprising a digital signal processing unit with one data input, one clock input and two digital outputs; and
    a DDAM according to claim 1; and
    a phase modulator with one digital input, one analog input and one analog output; and
    an analog power amplifier with one carrier input, one bias input and one output; and
    an digital input signal fed to the data input of the digital signal processing unit; and
    an analog input signal fed to the analog input of the phase modulator; and
    a clock input signal, synchronized with the digital input signal, fed to the clock input of the digital signal processing unit and the clock input of the DDAM according to claim 1 simultaneously; and
    the digital signal processing unit splits the digital input signal into an digital amplitude signal fed to the digital input of the DDAM according to claim 1 and an digital phase signal fed to the digital input of the phase modulator; and
    the analog output of the phase modulator which is a phase modulated constant envelop signal is fed to the carrier input of the analog power amplifier; and
    the output of the DDAM according to claim 1 is fed to the bias input of the analog power amplifier; and
    a polar modulated signal is obtained from the output of the power amplifier.

5. A first embodiment of the sub-switched current source unit according to claim 1; comprising:
    a register with one data input, one clock input, one data output and one inverse data output; and
    n-MOS transistors $M_1$, $M_2$, $M_3$, $M_4$ and $M_5$ with the sources of $M_1$ and $M_2$ and the drain of $M_3$ connected together, with the gate of $M_3$ and the drains of $M_4$ and $M_5$ connected together, and with the sources of $M_3$ and $M_5$ grounded; and
    an analog input signal and an inverse analog input signal, which can be differential RF or IF signals, are fed to the gates of $M_1$ and $M_2$ respectively; and two loads $Load_1$ and $Load_2$, which are not include in each sub-switched current source unit, with both end 1 of $Load_1$ and end 1 of $Load_2$ connected to power supply, with end 2 of Load$_1$ connected to the drain of M$_1$, and with end 2 of Load$_2$ connected to the drain of M$_2$; and a digital data input signal and a clock input signal connected to the data input and the clock input of the register respectively; and the data output of the register is connected to the gate of M$_4$ and the inverse data output of the register is connected to the gate of M$_5$; and a bias input signal is connected to the source of M$_4$; and differential analog outputs are obtained from the drains of M$_1$ and M$_2$, and either of them can be a single-ended analog output; and the dimensions of transistors M$_4$ and M$_5$ can be properly selected in order to set the switching time constant together with the parasitic capacitance to obtain a hold character somewhere between zero-order-hold and first-order-hold to achieve a higher attenuation for the alias signals; wherein transistors M$_1$ and M$_2$ can be separated from sub-switched current source unit and combined with other components, and wherein this structure can be realized by bipolar or other types of transistors as well, when p-MOS transistors are used, the structure of this embodiment is flipped complementarily.

6. A second embodiment of the sub-switched current source unit according to claim 1; comprising:

a register with one data input, one clock input, one data output and one inverse data output; and n-MOS transistors M$_1$, M$_2$ and M$_3$ with the sources of M$_1$ and M$_2$ and the drain of M$_3$ connected together, and with the source of M$_3$ grounded; and two loads Load$_1$ and Load$_2$, which are not include in each sub-switched current source unit, with both end 1 of Load$_1$ and end 1 of Load$_2$ connected to power supply, with end 2 of Load$_1$ connected to the drain of M$_1$, and with end 2 of Load$_2$ connected to the drain of M$_2$ respectively; and a digital data input signal and a clock input signal connected to the data input and the clock input of the register respectively; and the data output and the inverse data output of the register are connected to the gate of M$_1$ and the gate of M$_2$ respectively; and a bias input signal is connected to the gate of M$_3$; and wherein differential analog outputs are obtained from the drains of M$_1$ and M$_2$, and either of them can be a single-ended analog output, and wherein this structure can be realized by bipolar or other types of transistors as well, when p-MOS transistors are used, the structure of this embodiment is flipped complementarily.

7. An extension of the first embodiment of the sub-switched current source unit according to claim 1; comprising:

a register with one data input, one clock input, one data output and one inverse data output; and n-MOS transistors M$_1$, M$_2$, M$_3$, M$_4$, M$_5$, M$_6$, M$_7$, M$_9$, Mg and M$_{10}$ with the sources of M$_1$ and M$_2$ and the drain of M$_7$ connected together, the sources of M$_3$ and M$_4$ and the drain of M$_8$ connected together, with the gate of M$_7$, the drains of M$_5$ and M$_9$ connected together, and with the sources of M$_7$ and Mg grounded, with the gate of M$_8$ and the drains of M$_6$ and M$_{10}$ connected together, and with the sources of M$_8$ and M$_{10}$ grounded, and with the sources of M$_5$ and M$_6$ connected together, with the gates of M$_1$ and M$_4$ connected together, with the gates of M$_2$ and M$_3$ connected together, with the gates of M$_5$ and M$_{10}$ connected together, with the gates of M$_6$ and M$_9$ connected together, with the drains of M$_1$ and M$_3$ connected together, with the drains of M$_2$ and M$_4$ connected together; and an analog input signal is fed to the gates of M$_1$ and M$_4$, and an inverse analog input signal is fed to the gates of M$_2$ and M$_3$, the analog input signal and the inverse analog input signal can be differential RF or IF signals; and two loads Load$_1$ and Load$_2$, which are not include in each sub-switched current source unit, with both end 1 of Load$_1$ and end 1 of Load$_2$ connected to power supply, with end 2 of Load$_1$ connected to the drains of M$_1$ and M$_3$, and with end 2 of Load$_2$ connected to the drains of M$_2$ and M$_4$; and a digital data input signal and a clock input signal connected to the data input and the clock input of the register respectively; and the data output of the register is connected to the gates of M$_5$ and M$_{10}$, the inverse data output of the register is connected to the gates of M$_6$ and M$_9$; and a bias input signal is connected to the sources of M$_5$ and M$_6$; and differential analog outputs are obtained from end 2 of Load$_1$ and end 2 of Load$_2$, and either of them can be a single-ended analog output; and wherein the dimensions of transistors M$_5$ and M$_6$, M$_9$ and M$_{10}$ can be properly selected respectively in order to set the switching time constant together with the parasitic capacitance to obtain a hold character somewhere between zero-order-hold and first-order-hold to achieve a higher attenuation for the alias signals, and wherein this structure can be realized by bipolar or other types of transistors as well, when p-MOS transistors are used, the structure of this embodiment is flipped complementarily.

8. A direct digital amplitude modulator (DDAM) for generating an amplitude modulated signal; comprising:

an n-bit digital input with n parallel inputs, an analog input, a clock input and an output for receiving an n-bit digital input signal fed to the n-bit digital input for direct digital amplitude modulation, for receiving an analog input signal fed to the analog input to be modulated which can be an RF, IF or DC signal, and for receiving a clock input signal fed to the clock input synchronized with the digital input signal;

a clock delay line to produce delayed clock signals from the clock input signal with equal or unequal intervals in one period of the digital input signal;

a number of sub-switched current source units to be switched on or off according to the combinations of the digital input signal and the delayed clock signals to produce or to cancel quantized RF, IF or DC currents and/or voltages at the times precisely controlled by the delayed clock signals respectively;

a circuitry to combine the outputs of the sub-switched current source units;

wherein said sub-switched current source units are grouped into n groups controlled by n-bit digital input signals respectively;

wherein the values of currents and/or voltages generated by said groups calculated by the lumped current and/or voltage values of the sub-switched current source units in every groups may have binary weights;

wherein the values of currents and/or voltages generated by the said sub-switched current source units in each group can be equal in the case of linear interpolation or unequal in the case of nonlinear interpolation depending on the interpolation function; and wherein the effective clock frequency of the DDAM can be greatly increased by the above arrangement when the number of sub-switched current source units and also the number of delayed clocks increases to reduce alias signal components.

9. The direct digital amplitude modulator according to claim 8, wherein the sub-switched current source comprises:
a register with one data input, one clock input, one data output and one inverse data output;
n-MOS transistors $M_1$, $M_2$, $M_3$, $M_4$ and $M_5$ with the sources of $M_1$ and $M_2$ and the drain of $M_3$ connected together, with the gate of $M_3$ and the drains of $M_4$ and $M_5$ connected together, and with the sources of $M_3$ and $M_5$ grounded.

10. The direct digital amplitude modulator according to claim 9, wherein
an analog input signal and an inverse analog input signal, which can be differential RF or IF signals, are fed to the gates of $M_1$ and $M_2$ respectively; and two loads are coupled between a power supply and the drain of $M_1$ and $M_2$ respectively.

11. The direct digital amplitude modulator according to claim 10, wherein
a digital data input signal and a clock input signal are connected to the data input and the clock input of the register respectively;
the data output of the register is connected to the gate of $M_4$ and the inverse data output of the register is connected to the gate of $M_5$;
a bias input signal is connected to the source of $M_4$; and
differential analog outputs are obtained from the drains of $M_1$ and $M_2$, and either of them can be a single-ended analog output.

12. The direct digital amplitude modulator according to claim 11, wherein
the dimensions of transistors $M_4$ and $M_5$ can be properly selected in order to set the switching time constant together with the parasitic capacitance to obtain a hold character somewhere between zero-order-hold and first-order-hold to achieve a higher attenuation for the alias signals.

13. The direct digital amplitude modulator according to claim 12, wherein
transistors $M_1$ and $M_2$ can be separated from sub-switched current source unit and combined with other components.

14. The direct digital amplitude modulator according to claim 13, wherein
this structure can be realized by bipolar or other types of transistors as well, when p-MOS transistors are used, the structure of this embodiment is flipped complementarily.

15. The direct digital amplitude modulator according to claim 8, wherein the sub-switched current source comprises:
a register with one data input, one clock input, one data output and one inverse data output;
n-MOS transistors $M_1$, $M_2$ and $M_3$ with the sources of $M_1$ and $M_2$ and the drain of $M_3$ connected together, and with the source of $M_3$ grounded;
two loads coupled between a power supply and the drain of $M_1$ and $M_2$ respectively;
a digital data input signal and a clock input signal connected to the data input and the clock input of the register respectively;
the data output and the inverse data output of the register are connected to the gate of $M_1$ and the gate of $M_2$ respectively;
a bias input signal is connected to the gate of $M_3$;
differential analog outputs are obtained from the drains of $M_1$ and $M_2$, and either of them can be a single-ended analog output.

16. The direct digital amplitude modulator according to claim 15, wherein
this structure can be realized by bipolar or other types of transistors as well, when p-MOS transistors are used, the structure of this embodiment is flipped complementarily.

17. The direct digital amplitude modulator according to claim 8; wherein the sub-switched current source comprises:
a register with one data input, one clock input, one data output and one inverse data output;
n-MOS transistors $M_1$, $M_2$, $M_3$, $M_4$, $M_5$, $M_6$, $M_7$, $M_8$, $M_9$ and $M_{10}$ with the sources of $M_1$ and $M_2$ and the drain of $M_7$ connected together, the sources of $M_3$ and $M_4$ and the drain of $M_8$ connected together, with the gate of $M_7$, the drains of $M_5$ and $M_9$ connected together, and with the sources of $M_7$ and $M_9$ grounded, with the gate of $M_8$ and the drains of $M_6$ and $M_{10}$ connected together, and with the sources of $M_8$ and $M_{10}$ grounded, and with the sources of $M_5$ and $M_6$ connected together, with the gates of $M_1$ and $M_4$ connected together, with the gates of $M_2$ and $M_3$ connected together, with the gates of $M_5$ and $M_{10}$ connected together, with the gates of $M_6$ and $M_9$ connected together, with the drains of $M_1$ and $M_3$ connected together, with the drains of $M_2$ and $M_4$ connected together;
an analog input signal is fed to the gates of $M_1$ and $M_4$, and an inverse analog input signal is fed to the gates of $M_2$ and $M_3$, the analog input signal and the inverse analog input signal can be differential RF or IF signals;
two loads coupled between a power supply and the drain of $M_1$ and $M_2$ respectively;
a digital data input signal and a clock input signal connected to the data input and the clock input of the register respectively;
the data output of the register is connected to the gates of $M_5$ and $M_{10}$, the inverse data output of the register is connected to the gates of $M_6$ and $M_9$;
a bias input signal is connected to the sources of $M_5$ and $M_6$;
differential analog outputs are obtained from said loads, and either of them can be a single-ended analog output; and wherein
the dimensions of transistors $M_5$ and $M_6$, $M_9$ and $M_{10}$ can be properly selected respectively in order to set the switching time constant together with the parasitic capacitance to obtain a hold character somewhere between zero-order-hold and first-order-hold to achieve a higher attenuation for the alias signals.

18. A quadrature modulator; comprising:
a digital signal processing unit with one data input, one clock input and two digital outputs; and
two direct digital amplitude modulators (DDAM) for generating an amplitude modulated signal; each comprising:
an n-bit digital input with n parallel inputs, an analog input, a clock input and an output for receiving an n-bit digital input signal fed to the n-bit digital input for direct digital amplitude modulation, for receiving an analog input signal fed to the analog input to be modulated which can be an RF, IF or DC signal, and for receiving a clock input signal fed to the clock input synchronized with the digital input signal;

a clock delay line to produce delayed clock signals from the clock input signal with equal or unequal intervals in one period of the digital input signal;

a number of sub-switched current source units to be switched on or off according to the combinations of the digital input signal and the delayed clock signals to produce or to cancel quantized RF, IF or DC currents and/or voltages at the times precisely controlled by the delayed clock signals respectively;

a circuitry to combine the outputs of the sub-switched current source units;

wherein said sub-switched current source units are grouped into n groups controlled by n-bit digital input signals respectively;

wherein the values of currents and/or voltages generated by said groups calculated by the lumped current and/or voltage values of the sub-switched current source units in every groups may have binary weights;

wherein the values of currents and/or voltages generated by the said sub-switched current source units in each group can be equal in the case of linear interpolation or unequal in the case of nonlinear interpolation depending on the interpolation function; and wherein the effective clock frequency of the DDAM can be greatly increased by the above arrangement when the number of sub-switched current source units and also the number of delayed clocks increases to reduce alias signal components;

a combiner with two inputs and one output;

an digital input signal fed to the data input of the digital signal processing unit;

a clock input signal, synchronized with the digital input signal, fed to the clock input of the digital signal processing unit and the clock inputs of the two DDAMs simultaneously;

two analog input signals which phases are separated in 90 degrees fed to the analog inputs of two DDAMs respectively;

the digital signal processing unit splits the digital input signal into I digital signal and Q digital signal fed to the digital inputs of two DDAMs respectively;

the outputs of two DDAMs are fed to the two inputs of the combiner; and an quadrature modulated signal is obtained from the output of the combiner.

19. A polar modulator, comprising:

a digital signal processing unit with one data input, one clock input and two digital outputs;

a direct digital amplitude modulator (DDAM) for generating an amplitude modulated signal; comprising:

an n-bit digital input with n parallel inputs, an analog input, a clock input and an output for receiving an n-bit digital input signal fed to the n-bit digital input for direct digital amplitude modulation, for receiving an analog input signal fed to the analog input to be modulated which can be an RF, IF or DC signal, and for receiving a clock input signal fed to the clock input synchronized with the digital input signal;

a clock delay line to produce delayed clock signals from the clock input signal with equal or unequal intervals in one period of the digital input signal;

a number of sub-switched current source units to be switched on or off according to the combinations of the digital input signal and the delayed clock signals to produce or to cancel quantized RF, IF or DC currents and/or voltages at the times precisely controlled by the delayed clock signals respectively;

a circuitry to combine the outputs of the sub-switched current source units;

wherein said sub-switched current source units are grouped into n groups controlled by n-bit digital input signals respectively;

wherein the values of currents and/or voltages generated by said groups calculated by the lumped current and/or voltage values of the sub-switched current source units in every groups may have binary weights;

wherein the values of currents and/or voltages generated by the said sub-switched current source units in each group can be equal in the case of linear interpolation or unequal in the case of nonlinear interpolation depending on the interpolation function; and wherein the effective clock frequency of the DDAM can be greatly increased by the above arrangement when the number of sub-switched current source units and also the number of delayed clocks increases to reduce alias signal components;

a phase modulator with one digital input, one analog input and one analog output; and an digital input signal fed to the data input of the digital signal processing unit;

an analog input signal fed to the analog input of the phase modulator;

a clock input signal, synchronized with the digital input signal, fed to the clock input of the digital signal processing unit and the clock input of the DDAM simultaneously;

the digital signal processing unit splits the digital input signal into an digital amplitude signal fed to the digital input of the DDAM and an digital phase signal fed to the digital input of the phase modulator;

the analog output of the phase modulator which is a phase modulated constant envelop signal is fed to the analog input of the DDAM; and a polar modulated signal is obtained from the output of the DDAM.

20. A polar modulator; comprising:

a digital signal processing unit with one data input, one clock input and two digital outputs;

a direct digital amplitude modulator (DDAM) for generating an amplitude modulated signal; comprising:

an n-bit digital input with n parallel inputs, an analog input, a clock input and an output for receiving an n-bit digital input signal fed to the n-bit digital input for direct digital amplitude modulation, for receiving an analog input signal fed to the analog input to be modulated which can be an RF, IF or DC signal, and for receiving a clock input signal fed to the clock input synchronized with the digital input signal;

a clock delay line to produce delayed clock signals from the clock input signal with equal or unequal intervals in one period of the digital input signal;

a number of sub-switched current source units to be switched on or off according to the combinations of the digital input signal and the delayed clock signals to produce or to cancel quantized RF, IF or DC currents and/or voltages at the times precisely controlled by the delayed clock signals respectively;

a circuitry to combine the outputs of the sub-switched current source units;

wherein said sub-switched current source units are grouped into n groups controlled by n-bit digital input signals respectively;

wherein the values of currents and/or voltages generated by said groups calculated by the lumped current and/or voltage values of the sub-switched current source units in every groups may have binary weights;

wherein the values of currents and/or voltages generated by the said sub-switched current source units in each group can be equal in the case of linear interpolation or unequal in the case of nonlinear interpolation depending on the interpolation function; and wherein the effective clock frequency of the DDAM can be greatly increased by the above arrangement when the number of sub-switched current source units and also the number of delayed clocks increases to reduce alias signal components;

a phase modulator with one digital input, one analog input and one analog output;

an analog power amplifier with one carrier input, one bias input and one output;

an digital input signal fed to the data input of the digital signal processing unit;

an analog input signal fed to the analog input of the phase modulator;

a clock input signal, synchronized with the digital input signal, fed to the clock input of the digital signal processing unit and the clock input of the DDAM simultaneously;

the digital signal processing unit splits the digital input signal into an digital amplitude signal fed to the digital input of the DDAM and an digital phase signal fed to the digital input of the phase modulator;

the analog output of the phase modulator which is a phase modulated constant envelop signal is fed to the carrier input of the analog power amplifier;

the output of the DDAM is fed to the bias input of the analog power amplifier; and a polar modulated signal is obtained from the output of the power amplifier.

* * * * *